(12) United States Patent
Tapily

(10) Patent No.: US 11,443,949 B2
(45) Date of Patent: Sep. 13, 2022

(54) METHOD OF SELECTIVELY FORMING METAL SILICIDES FOR SEMICONDUCTOR DEVICES

(71) Applicant: Tokyo Electron Limited, Tokyo (JP)

(72) Inventor: Kandabara N. Tapily, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 114 days.

(21) Appl. No.: 16/823,071

(22) Filed: Mar. 18, 2020

(65) Prior Publication Data

US 2020/0303195 A1    Sep. 24, 2020

Related U.S. Application Data

(60) Provisional application No. 62/821,299, filed on Mar. 20, 2019.

(51) Int. Cl.
*H01L 21/285* (2006.01)
*H01L 21/8238* (2006.01)

(52) U.S. Cl.
CPC .......... *H01L 21/28518* (2013.01); *H01L 21/823871* (2013.01)

(58) Field of Classification Search
CPC ....... H01L 21/28518; H01L 21/823814; H01L 21/823871
See application file for complete search history.

(56) References Cited

U.S. PATENT DOCUMENTS 6,103,559 A * 8/2000 Gardner ............ H01L 21/28052
257/E21.199
7,625,801 B2   12/2009 Wu et al.
(Continued)

FOREIGN PATENT DOCUMENTS

KR   10-2018-0002766 A   1/2018
WO      2016-069132 A1   5/2016

OTHER PUBLICATIONS

Korean Intellectual Property Office, International Search Report and Written Opinion for International application No. PCT/US2020/023386, dated Jul. 15, 2020,11pp.

*Primary Examiner* — John A Bodnar

(57) ABSTRACT

A substrate processing method includes providing a substrate containing a first semiconductor material and a second semiconductor material, treating the first semiconductor material and the second semiconductor material with a chemical source that selectively forms a chemical layer on the second semiconductor material relative to the first semiconductor material, and exposing the substrate to a first metal-containing precursor that selectively deposits a first metal-containing layer on the first semiconductor material relative to the chemical layer on the second semiconductor material. The method can further include annealing the substrate to react the first metal-containing layer with the first semiconductor material to form a first metal silicide layer, removing the chemical layer from the second semiconductor material, depositing a second metal-containing layer on the second semiconductor material, and annealing the substrate to react the second metal-containing layer with the second semiconductor material to form a second metal silicide layer.

14 Claims, 8 Drawing Sheets

(56) References Cited

U.S. PATENT DOCUMENTS

| | | |
|---|---|---|
| 2002/0187656 A1* | 12/2002 | Tan .................. H01L 21/31612 |
| | | 438/788 |
| 2006/0121665 A1* | 6/2006 | Fang ............... H01L 21/823814 |
| | | 438/199 |
| 2006/0170058 A1 | 8/2006 | Chiang et al. |
| 2007/0105357 A1* | 5/2007 | Nejad ............. H01L 21/823418 |
| | | 438/586 |
| 2008/0227278 A1 | 9/2008 | Hase |
| 2013/0196505 A1 | 8/2013 | Hasegawa |
| 2014/0210011 A1 | 7/2014 | Baraskar et al. |
| 2015/0243751 A1 | 8/2015 | Liu et al. |
| 2016/0322229 A1 | 11/2016 | Ganguli et al. |
| 2017/0259298 A1 | 9/2017 | Woodruff et al. |
| 2017/0301550 A1 | 10/2017 | Tapily |

* cited by examiner

METHOD OF SELECTIVELY FORMING METAL SILICIDES FOR SEMICONDUCTOR DEVICES

CROSS-REFERENCE TO RELATED APPLICATIONS

This application is related to and claims priority to U.S. Provisional Patent Application Ser. No. 62/821,299 filed on Mar. 20, 2019, the entire contents of which are herein incorporated by reference.

FIELD OF INVENTION

The present invention relates to the field of semiconductor manufacturing and semiconductor devices, and more particularly, to a method of selectively forming metal silicides for semiconductor devices.

BACKGROUND OF THE INVENTION

Advanced metallization is getting extremely challenging due to aggressive scaling. As semiconductor device feature sizes are scaled, contacts are becoming significant problems in performance improvement. This is mainly due to the increase in electrical resistance (Rs) in the contact region. One way of reducing electrical resistance in the contact region of a semiconductor device is to use low electrical resistance silicide contacts in negative and positive channel devices and use low electrical resistance metal plugs in the recessed features above the contacts. Dual silicide schemes for negative and positive channel devices may be used but require multiple patterning steps which can result in low throughput, high cost, and multi-patterning issues (e.g., Edge Placement Error (EPE)).

SUMMARY OF THE INVENTION

Embodiments of the invention provide a substrate processing method for selectively depositing metal-containing layers on a substrate and forming metal silicides for semiconductor devices. The substrate processing method utilizes an area selective deposition that reduces the number of patterning steps required for forming a semiconductor device with different metal silicide regions, for example positive-channel field emission transistor (PFET) contact regions and negative-channel field emission transistor (NFET) contact regions.

According to one embodiment, a substrate processing method is described that includes providing a substrate containing a first semiconductor material and a second semiconductor material, treating the first semiconductor material and the second semiconductor material with a chemical source that selectively forms a chemical layer on the second semiconductor material relative to the first semiconductor material, and exposing the substrate to a first metal-containing precursor that selectively deposits a first metal-containing layer on the first semiconductor material relative to the chemical layer on the second semiconductor material. The method can further include annealing the substrate to react the first metal-containing layer with the first semiconductor material to form a first metal silicide layer, removing the chemical layer from the second semiconductor material, depositing a second metal-containing layer on the second semiconductor material, and annealing the substrate to react the second metal-containing layer with the second semiconductor material to form a second metal silicide layer.

The substrate can include a positive-channel field effect transistor (PFET) contact region that contains the first semiconductor material and a negative-channel field effect transistor (NFET) contact region that contains the second semiconductor material. In one example, the first semiconductor material includes doped SiGe or doped Ge and the second semiconductor material includes doped Si. In one example, the first metal-containing layer includes ruthenium (Ru) metal, platinum (Pt) metal, cobalt (Co) metal, nickel (Ni) metal, palladium (Pd) metal, molybdenum (Mo) metal, tungsten (W) metal, vanadium (V) metal, or a combination thereof. In one example, the second metal-containing layer includes titanium (Ti) metal, nickel (Ni) metal, a NiPt alloy, Co metal, molybdenum (Mo) metal, tungsten (W) metal, vanadium (V) metal, or a combination thereof.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1A:
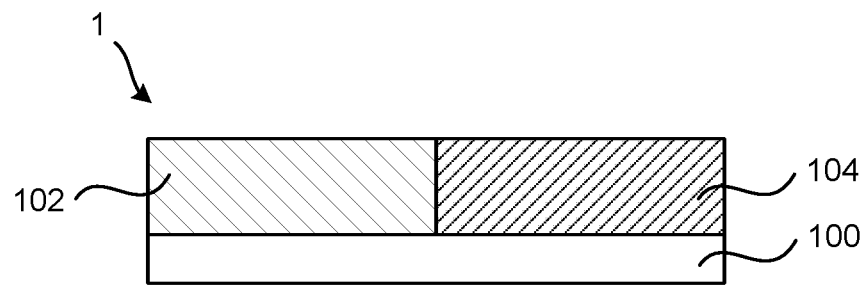
FIGS. 1A-1H schematically show through cross-sectional views a method of selectively forming metal silicides on a substrate according to an embodiment of the invention.

FIGS. 1A-1H schematically show through cross-sectional views a method of selectively forming metal silicides on a substrate according to an embodiment of the invention. FIG. 1A shows a substrate 1 containing a base layer 100, and a first semiconductor material 102 and a second semiconductor material 104 on the base layer 100. In one embodiment, the first semiconductor material 102 includes a germanium-containing material, for example silicon germanium or germanium. The germanium can include pure or nearly pure germanium. Silicon germanium can be expressed as SiGe or $Si_xGe_{1-x}$, where x is the atomic fraction of Si, 1-x is the atomic fraction of Ge, and $0<x<1$. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. The first semiconductor material 102 (SiGe or Ge) may be doped with boron (B), gallium (Ga), or aluminum (Al). The second semiconductor material 104 can include doped Si, where the dopant can include phosphorus (P), antimony (Sb), arsenic (As), or bismuth (Bi).

Figure 1B:
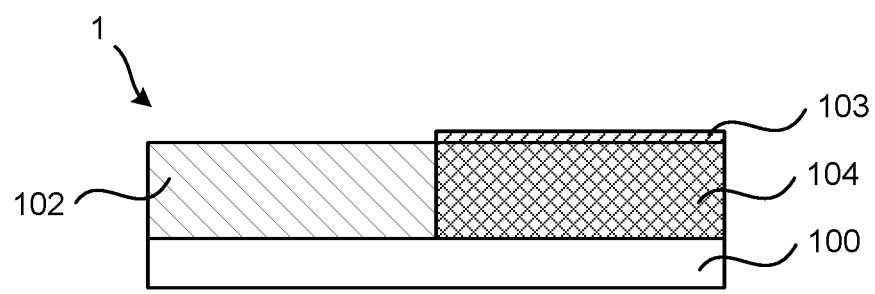

FIG. 1B shows a chemical layer 103 that is selectively formed on the second semiconductor material 104, relative to the first semiconductor material 102. The chemical layer 103 may be formed by treating the substrate 1 with a chemical source that selectively and chemically modifies the second semiconductor material 104 but not the first semiconductor material 102. According to embodiments of the invention, the chemical layer 103 may include any chemical elements that selectively react with a surface of the second semiconductor material 104, and where the chemical layer 103 hinders vapor phase deposition of a metal-containing material on the chemical layer 103 in a separate subsequent processing step. In one example, the chemical layer 103 includes an oxide layer. However, a chemical layer 103 containing other chemical elements than oxygen may be used. Below, an oxide layer 103 is used to illustrate some embodiments of the invention.

In one example, the oxide layer 103 (e.g., $SiO_x$) may be formed on the second semiconductor material 104 by treating the substrate 1 with a plasma-excited process gas containing $H_2$ and $O_2$. In one example, Ar gas may be added to the process gas. The plasma may be formed from the process gas using a plasma source. The plasma source can include a parallel-plate plasma source, a capacitively coupled plasma (CCP) source, an inductively coupled plasma (ICP) source, very high frequency plasma (VHF) plasma, any combination thereof, and with or without DC magnet systems. Alternately, the processing plasma in the process chamber can be formed using electron cyclotron resonance (ECR). According to one embodiment, the plasma source can include a microwave plasma source. In one example, the microwave plasma source may be a RLSA™ plasma source from Tokyo Electron Limited, Akasaka, Japan.

The plasma exposure time when forming the oxide layer 103 can be between 10 sec and 600 sec, between 10 sec and 50 sec, or between 10 sec and 100 sec, for example. The plasma process chamber pressure can below 0.1 Torr, below 0.2 Torr, below 0.5 Torr, below 1 Torr, below 5 Torr, between 0.05 and 0.1 Torr, between 0.1 and 0.5 Torr, or between 0.1 and 1 Torr, for example. Microwave plasma power can be between 1000 W and 3000 W, below 3000 W, or below 2500 W, for example. The substrate can be maintained at a temperature between about room temperature and about 250° C., between about room temperature and about 400° C., or between about 250° C. temperature and about 400° C.

Figure 3:
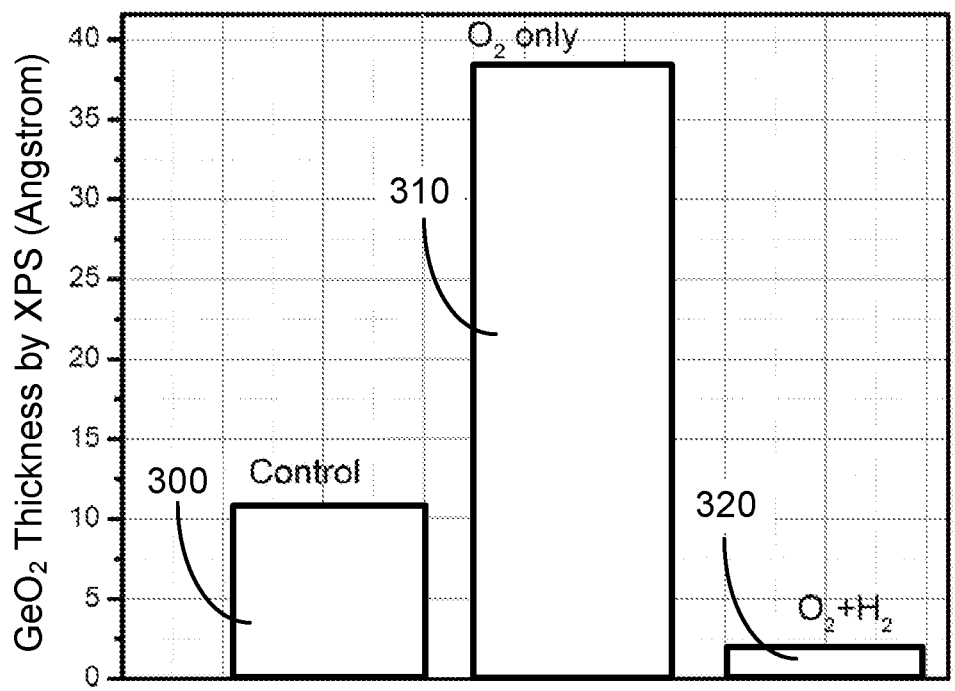
FIG. 3 shows $GeO_2$ thickness measured by X-ray Photoelectron Spectroscopy (XPS) for different substrates.
Figure 4:
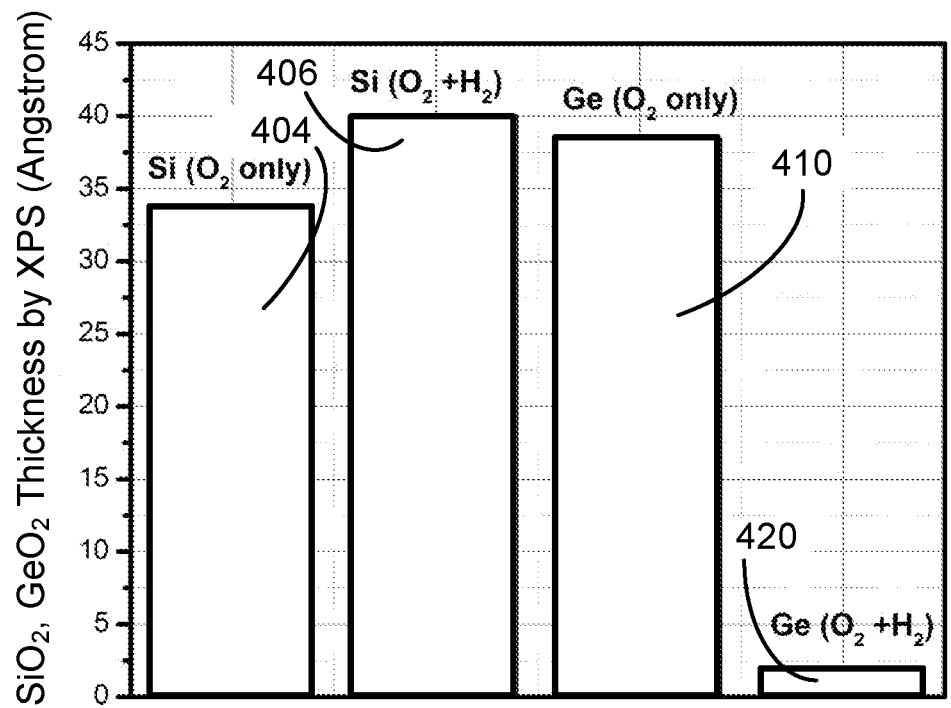
FIG. 4 shows $SiO_2$ and $GeO_2$ thicknesses measured by XPS for different substrates.

FIGS. 3 and 4 show experimental results for exposing Si and Ge substrates to a plasma-excited process gas containing $O_2$, or $H_2$ and $O_2$.

FIG. 3 show $GeO_2$ thickness measured by XPS for Ge substrates. The control substrate 300 was not exposed to a plasma-excited process gas and contained a $GeO_2$ layer (native $GeO_2$ layer) that was formed during air exposure of a Ge substrate. Substrate 310 contained a native $GeO_2$ layer that was exposed to a plasma containing $O_2$ gas, and substrate 320 contained a native $GeO_2$ layer that was exposed to a plasma containing $H_2$ gas and $O_2$ gas. The $GeO_2$ layer thicknesses were about 11 angstrom for the substrate 300, about 38 angstrom for the substrate 310, and about 2 angstrom for the substrate 320. These results show that the exposure to a plasma containing $O_2$ gas increased the $GeO_2$ thickness from about 11 angstrom to about 38 angstrom, but the exposure to a plasma containing $O_2$ gas and $H_2$ gas decreased the $GeO_2$ thickness from about 11 angstrom to about 2 angstrom. The plasma processing conditions for the substrates in FIG. 3 were as follows: Plasma containing $O_2$ gas: gas flows $Ar/O_2$=2000 sccm/10 sccm, substrate temperature=250° C., plasma exposure time=300 sec, process chamber pressure=0.09 Torr, and microwave plasma power=2000 W. Plasma containing $H_2$ gas and $O_2$ gas: gas flows $Ar/O_2/H_2$=2000 sccm/10 sccm/100 sccm, substrate temperature=250° C., plasma exposure time=300 sec, process chamber pressure=0.09 Torr, and microwave plasma power=2000 W.

FIG. 4 shows $SiO_2$ and $GeO_2$ thicknesses measured by XPS for different substrates. The plasma processing conditions for a plasma containing $O_2$ gas and a plasma containing $H_2$ gas and $O_2$ gas were described above in FIG. 3. The control substrate (not shown) contained a native $SiO_2$ layer with a thickness of about 10 angstrom. Substrate 404 contained a native $SiO_2$ layer that was exposed to a plasma containing $O_2$ gas, and substrate 406 contained a native $SiO_2$ layer was exposed to a plasma containing $H_2$ gas and $O_2$ gas. Substrates 410 and 420 are the same as substrates 310 and 320 in FIG. 3, respectively. The measured $SiO_2$ thickness was about 33 angstrom for substrate 404, and about 40 angstrom for substrate 406.

The results in FIGS. 3 and 4 show that Si substrates are effectively oxidized using a plasma containing $O_2$ gas, or a plasma containing $H_2$ gas and $O_2$ gas. However, unexpectedly, substrates containing Ge are effectively oxidized using plasma containing $O_2$ gas, but are effectively reduced using a plasma containing $H_2$ gas and $O_2$ gas. The inventors have realized that this unexpected difference between the oxidation of Si and Ge using a plasma containing $H_2$ gas and $O_2$ gas may be utilized to effectively process substrates containing Si and Ge for many semiconductor devices.

Figure 1C:
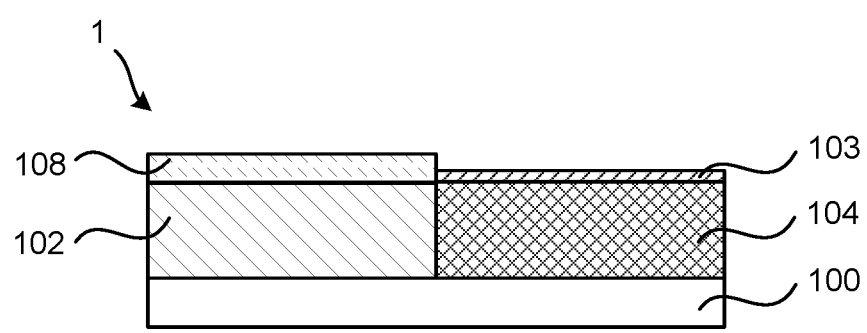

FIG. 1C shows a first metal-containing layer 108 that is selectively deposited on the first semiconductor material 102, relative to the oxide layer 103 on the second semiconductor material 104. The first metal-containing layer 108 may be formed by vapor phase deposition that includes exposing the substrate to a gaseous first metal-containing precursor that selectively reacts with and deposits the first metal-containing layer 108 on the first semiconductor material 102. Vapor phase deposition of many metals, especially noble metals, can be highly selective due to poor metal nucleation on oxide layers and many dielectric materials. The vapor phase deposition can, for example, include chemical vapor deposition (CVD), plasma-enhanced CVD (PECVD), atomic layer deposition (ALD), or plasma-enhanced ALD (PEALD). In contrast, the first metal-containing precursor does not react with the oxide layer 103 and therefore the first metal-containing layer 108 is not formed over the second semiconductor material 104. The first metal-containing layer 108 can include a p-type metal, for example ruthenium (Ru) metal, platinum (Pt) metal, cobalt (Co) metal, nickel (Ni) metal, palladium (Pd) metal, molybdenum (Mo) metal, tungsten (W) metal, vanadium (V) metal, or a combination thereof. In one example, the first metal-containing layer 108 may contain or consist of Ru metal and the first metal-containing precursor can include $Ru_3(CO)_{12}$ that is transported to the substrate 1 using a CO carrier gas. An optional cleaning step may be performed to remove any unwanted metal-containing nuclei (not shown) from the oxide layer 103 if the deposition of the first metal-containing layer 108 is not selective enough. The optional cleaning step can include dry etching or wet etching.

Figure 1D:
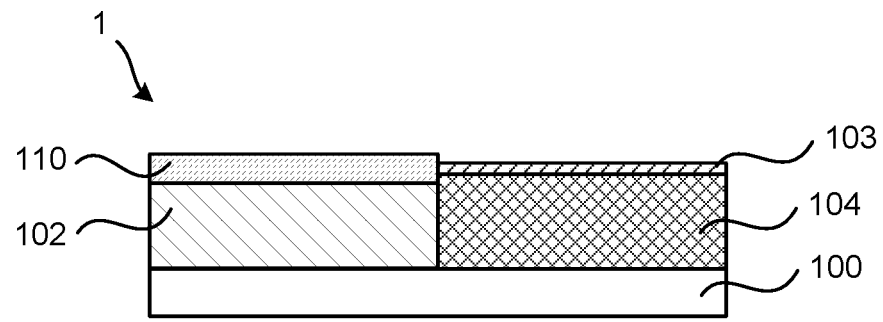

FIG. 1D shows the substrate 1 following a substrate annealing process that reacts the first metal-containing layer 108 (e.g., Ru metal) with the first semiconductor material 102 to form a first metal silicide layer 110 (e.g., $RuSi_x$). Exemplary annealing temperatures can be between about 100° C. and about 500° C. Although not shown in FIG. 1D, only a portion of the first metal-containing layer 108 may react to form the first metal silicide layer 110, thereby leaving an unreacted portion of the first metal-containing layer 108 on the first metal silicide layer 110. Any unreacted portion of the first metal-containing layer 108 may optionally be removed from the first metal silicide layer 110 in a dry or wet etching process. In one example, the substrate 1 may be annealed at a first annealing temperature to react a portion of the first metal-containing layer 108 with the first semiconductor material 102 to form a desired crystallographic silicide phase, thereafter removing any unreacted portion of the first metal-containing layer 108 in a cleaning process and, thereafter, annealing the substrate 1 at a second annealing temperature to achieve a lower electrical resistivity for the first metal silicide layer 110. The second annealing temperature can be higher, lower, or the same as the first annealing temperature.

Ruthenium metal is a promising candidate for lower level interconnect metallization in advanced nodes because of its low resistivity and long mean free path, combined with barrierless integration. With the transition from planar devices and self-aligned silicide contacts to 3D FINFETs and trench contacts, the effective contact length has gone down by an order of magnitude. This has changed the primary criteria for silicide contact to be the lowest contact resistivity($\rho c$) at the Si-contact interface. Ruthenium silicide ($RuSi_x$) is one of the emerging silicide contacts being considered for PFETs.

Figure 1E:
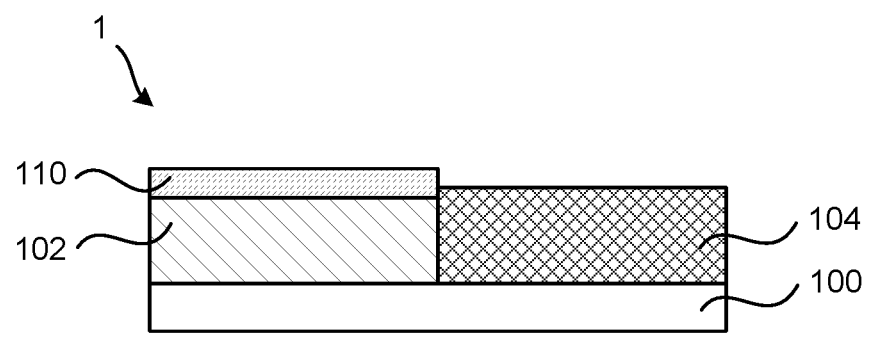

FIG. 1E shows the substrate 1 after removing the oxide layer 103 from the second semiconductor material 104. The oxide layer 103 may, for example, be removed using a chemical oxide removal (COR) process that exposes the substrate 1 to HF gas and $NH_3$ gas, followed by a heat-treatment that removes reaction byproducts from the substrate 1. In one embodiment, the oxide layer 103 may be removed before performing the substrate annealing process that forms the first metal silicide layer 110.

Figure 1F:
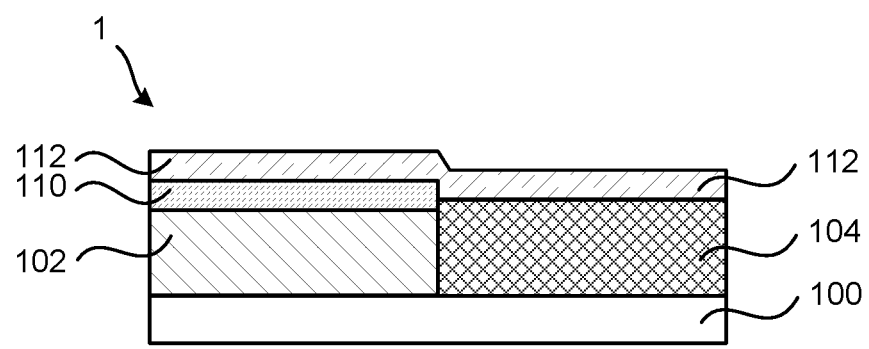

FIG. 1F shows a second metal-containing layer 112 that is non-selectively deposited on the substrate 1, including on the first metal silicide layer 110 and on the second semiconductor material 104. The second metal-containing layer 112 may be deposited by vapor phase deposition, for example by CVD, PECVD, ALD, PEALD, or sputtering. In some examples, the second metal-containing layer 112 can include Ti metal, Ni metal, NiPt alloy, Co metal, molybdenum (Mo) metal, tungsten (W) metal, vanadium (V) metal, or a combination thereof. In some examples, the second metal-containing layer 112 may be selectively deposited on the second semiconductor material 104 and not on the first metal silicide layer 110.

Figure 1G:
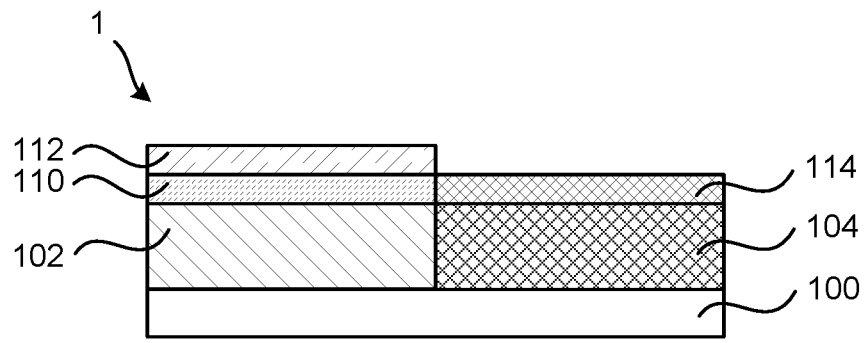
Figure 1H:
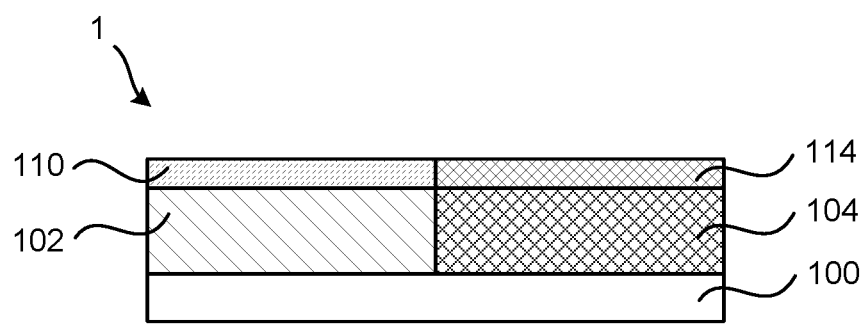

FIG. 1G shows the substrate 1 following a substrate annealing process that reacts the second metal-containing layer 112 with the second semiconductor material 104 to form a second metal silicide layer 114. In some examples, the second metal silicide layer 114 can include $TiSi_x$, $NiSi_x$, $NiPtSi_x$, $CoSi_x$, $MoSi_x$, $WSi_x$, $VSi_x$, or a combination thereof. In some examples, the second metal silicide layer 114 can include a ternary silicide, for example $VCrSi_x$ or $VCoSi_x$. Although not shown in FIG. 1G, only a portion of the second metal-containing layer 112 may react to form the second metal silicide layer 114 on the second semiconductor material 104, thereby leaving an unreacted portion of the second metal-containing layer 112 on the second metal silicide layer 114. Any unreacted portion of the second metal-containing layer 112 on the first semiconductor material 102 and on the second semiconductor material 104 may optionally be removed from the substrate 1 in a dry or wet etching process. The resulting substrate 1 is shown in FIG. 1H and contains the first metal silicide layer 110 on the first semiconductor material 102 and the second metal silicide layer 114 on the second semiconductor material 104.

Figure 2A:
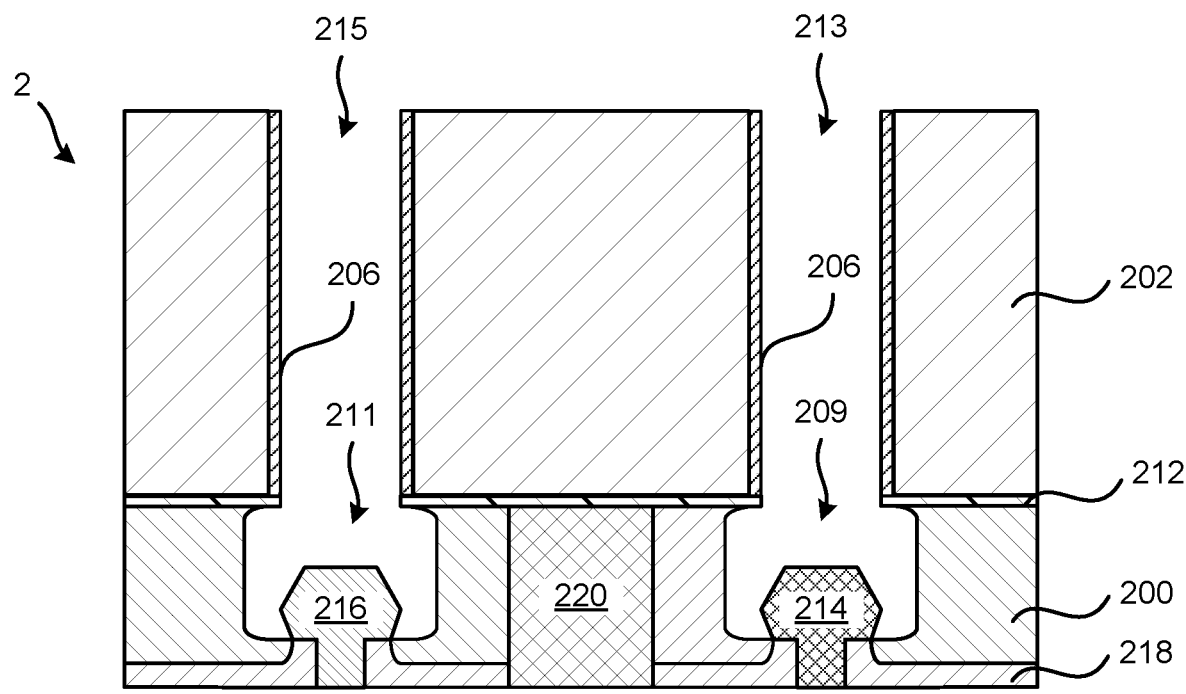
FIGS. 2A-2H schematically show through cross-sectional views a method of selectively forming metal silicides in a semiconductor device according to an embodiment of the invention.

FIGS. 2A-2H schematically show through cross-sectional views a method of selectively forming metal silicides in a semiconductor device according to an embodiment of the invention. Referring now to FIG. 2A, a partially manufactured semiconductor device contains a substrate 2 with a first raised contact 216 in a positive-channel field effect transistor (PFET) region and a second raised contact 214 in a negative-channel field effect transistor (NFET) region in a first dielectric film 200, a second dielectric film 202 above the first dielectric film 200, and a shallow trench isolation (STI) layer 220. The substrate 2 further includes an etch stop layer 212 on the first dielectric film 200, and a dielectric film 218 underneath the first dielectric film 200. The etch stop layer 212 may be used to terminate etching during the formation of the recessed features 215 and 213 in the second dielectric film 202. In some examples, the first dielectric film 200 may contain $SiO_2$, SiON, SiN, a high-k material, a low-k material, or an ultra-low-k material. In some examples, the second dielectric film 202 may contain $SiO_2$, SiON, SiN, a high-k material, a low-k material, or an ultra-low-k material. The first raised contact 216 includes a first semiconductor material that can include SiGe or Ge and the second raised contact 214 includes a second semiconductor material that can include doped silicon Si. Silicon germanium can be expressed as SiGe or $Si_xGe_{1-x}$, where x is the atomic fraction of Si, 1-x is the atomic fraction of Ge, and 0<x<1. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. The first semiconductor material (SiGe or Ge) may be doped with boron (B), gallium (Ga), or aluminum (Al). The second semiconductor material can include doped Si, where the dopant can include phosphorus (P), antimony (Sb), arsenic (As), or bismuth (Bi).

The first and second semiconductor materials may be epitaxially grown. The etch stop layer 212 may, for example, include a high-k material, SiN, $SiO_2$, or carbon (C). The substrate 2 further includes a sidewall protection film 206 on the sidewalls of the recessed features 215 and 213, and contact openings 211 and 209 formed in the first dielectric film 200 below the recessed features 215 and 213, respectively.

Figure 2B:
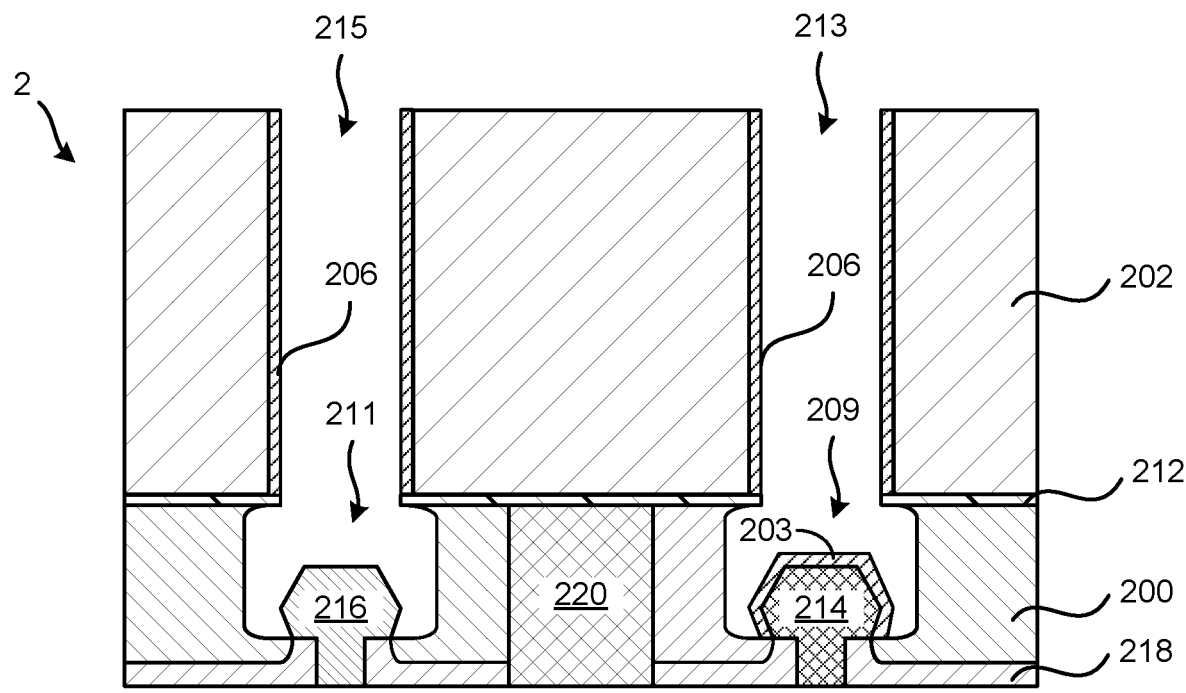

FIG. 2B shows a chemical layer 203 that is selectively formed on the second raised contact 214, relative to the first raised contact 216. The chemical layer 203 may be formed by treating the substrate 2 with a chemical source that selectively and chemically modifies the second raised contact 214 (second semiconductor material) but not the first raised contact 216 (first semiconductor material). According to embodiments of the invention, the chemical layer 203 may include any chemical elements that selectively react with a surface of the second raised contact 214, and where the chemical layer 203 hinders vapor phase deposition of a metal-containing material on the chemical layer 203 in a separate subsequent processing step. In one example, the chemical layer 203 includes an oxide layer. However, a chemical layer 203 containing other chemical elements may be used. Below, an oxide layer 203 is used to illustrate some embodiments of the invention.

FIG. 2B shows an oxide layer 203 that is selectively formed on the second raised contact 214, relative to the first raised contact 216, by selectively oxidizing a surface of the second raised contact 214. In one example, the oxide layer 203 (e.g., $SiO_x$) may be formed on the second raised contact 214 by treating the substrate 2 with a plasma-excited process gas containing $H_2$ and $O_2$. In one example, Ar gas may be added to the process gas. The plasma may be formed from the process gas using a plasma source. The plasma source can include a parallel-plate plasma source, a capacitively coupled plasma (CCP) source, an inductively coupled plasma (ICP) source, very high frequency plasma (VHF)

plasma, any combination thereof, and with or without DC magnet systems. Alternately, the processing plasma in the process chamber can be formed using electron cyclotron resonance (ECR). According to one embodiment, the plasma source can include a microwave plasma source.

The plasma exposure time when forming the oxide layer 203 can be between 10 sec and 600 sec, between 10 sec and 50 sec, or between 10 sec and 100 sec, for example. The plasma process chamber pressure can below 0.1 Torr, below 0.2 Torr, below 0.5 Torr, below 1 Torr, below 5 Torr, between 0.05 and 0.1 Torr, between 0.1 and 0.5 Torr, or between 0.1 and 1 Torr, for example. Microwave plasma power can be between 1000 W and 3000 W, below 3000 W, or below 2500 W, for example. The substrate can be maintained at a temperature between about room temperature and about 250° C., between about room temperature and about 400° C., or between about 250° C. temperature and about 400° C.

Figure 2C:
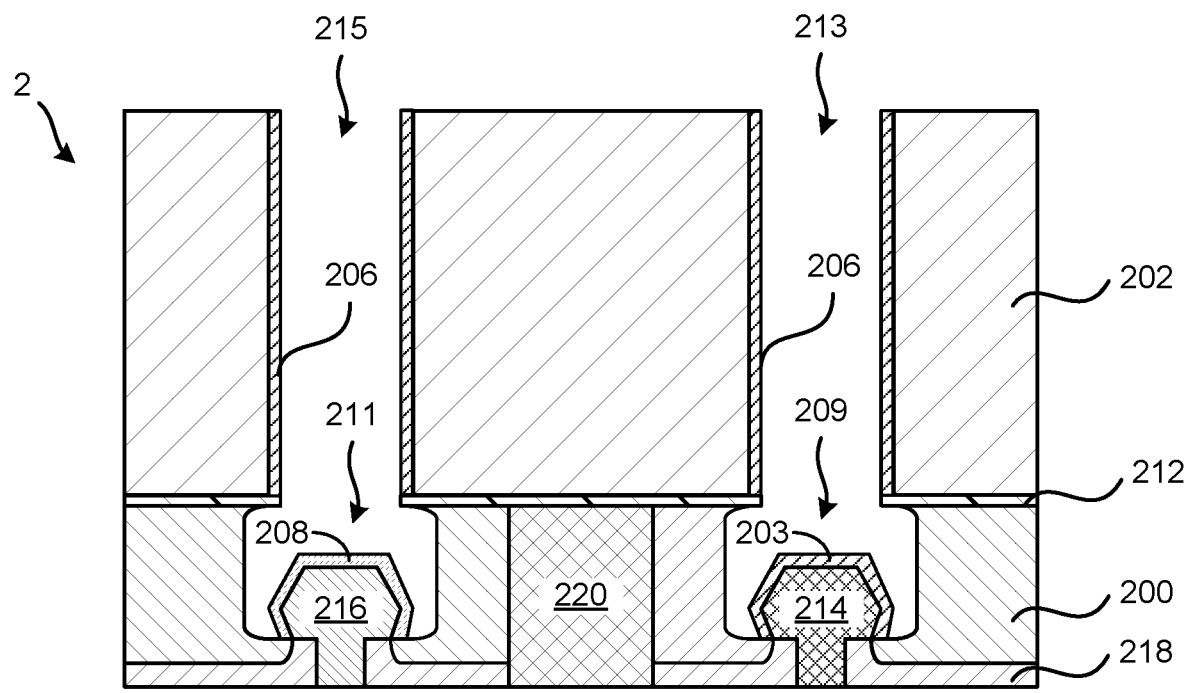

FIG. 2C shows a first metal-containing layer 208 that is selectively deposited on the first raised contact 216, relative to the oxide layer 203 on the second raised contact 214. The first metal-containing layer 208 may be formed by vapor phase deposition that includes exposing the substrate to a gaseous first metal-containing precursor that selectively reacts with and deposits the first metal-containing layer 208 on the first raised contact 216. The vapor phase deposition can, for example, include CVD, PECVD, ALD, or PEALD. In contrast, the first metal-containing precursor does not react with the oxide layer 203 and therefore the first metal-containing layer 208 is not formed over the second raised contact 214. The first metal-containing layer 108 can include a p-type metal, for example Ru metal, Pt metal, Co metal, Ni metal, Pd metal, Mo metal, W metal, V metal, or a combination thereof. In one example, the first metal-containing layer 208 may contain or consist of Ru metal and the first metal-containing precursor can include $Ru_3(CO)_{12}$ that is transported to the substrate using a CO carrier gas.

Figure 2D:
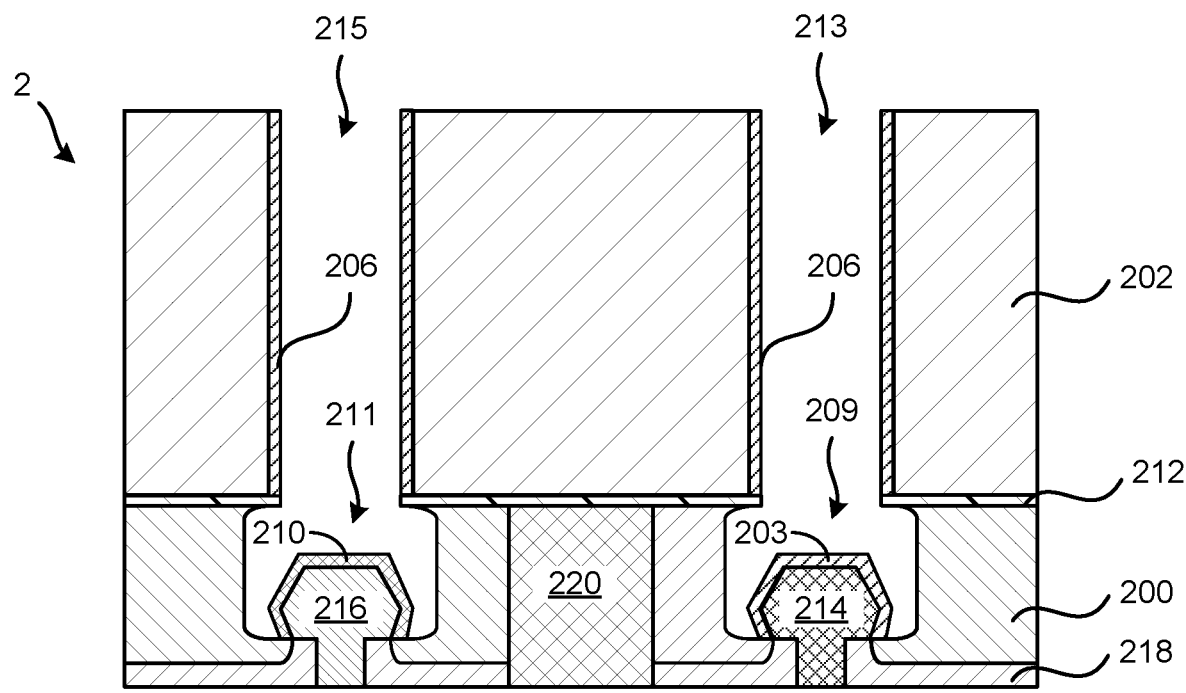

FIG. 2D shows the substrate 2 following a substrate annealing process that reacts the first metal-containing layer 208 (e.g., Ru metal) with the first semiconductor material of the first raised contact 216 to form a first metal silicide layer 210 (e.g., $RuSi_x$). Exemplary annealing temperatures can be between about 100° C. and about 500° C. Although not shown in FIG. 2D, only a portion of the first metal-containing layer 208 may react to form the first metal silicide layer 210, thereby leaving an unreacted portion of the first metal-containing layer 208 on the first metal silicide layer 210. Any unreacted portion of the first metal-containing layer 208 may optionally be removed from the first metal silicide layer 210 in a dry or wet etching process. In one example, the substrate 2 may be annealed at a first annealing temperature to react a portion of the first metal-containing layer 208 with the first semiconductor material to form a desired crystallographic silicide phase, thereafter removing any unreacted portion of the first metal-containing layer 208 in a cleaning process and, thereafter, annealing the substrate 2 at a second annealing temperature to achieve a lower electrical resistivity. The second annealing temperature can be higher, lower, or the same as the first annealing temperature.

Figure 2E:
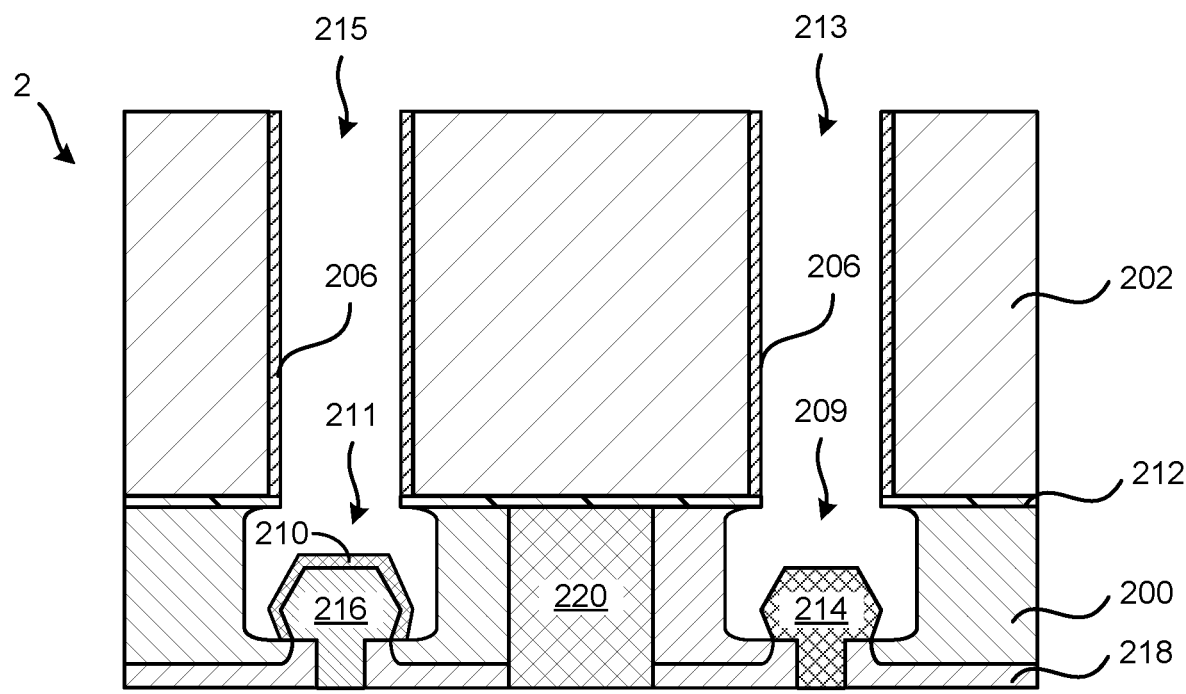

FIG. 2E shows the substrate 2 after removing the oxide layer 203 from the second raised contact 214. The oxide layer 203 may, for example, be removed using a chemical oxide removal (COR) process that exposes the substrate 2 to HF gas and $NH_3$ gas, followed by a heat-treatment that removes reaction byproducts from the substrate 2. In one embodiment, the oxide layer 203 may be removed before performing the substrate annealing process that forms the first metal silicide layer 210.

Figure 2F:
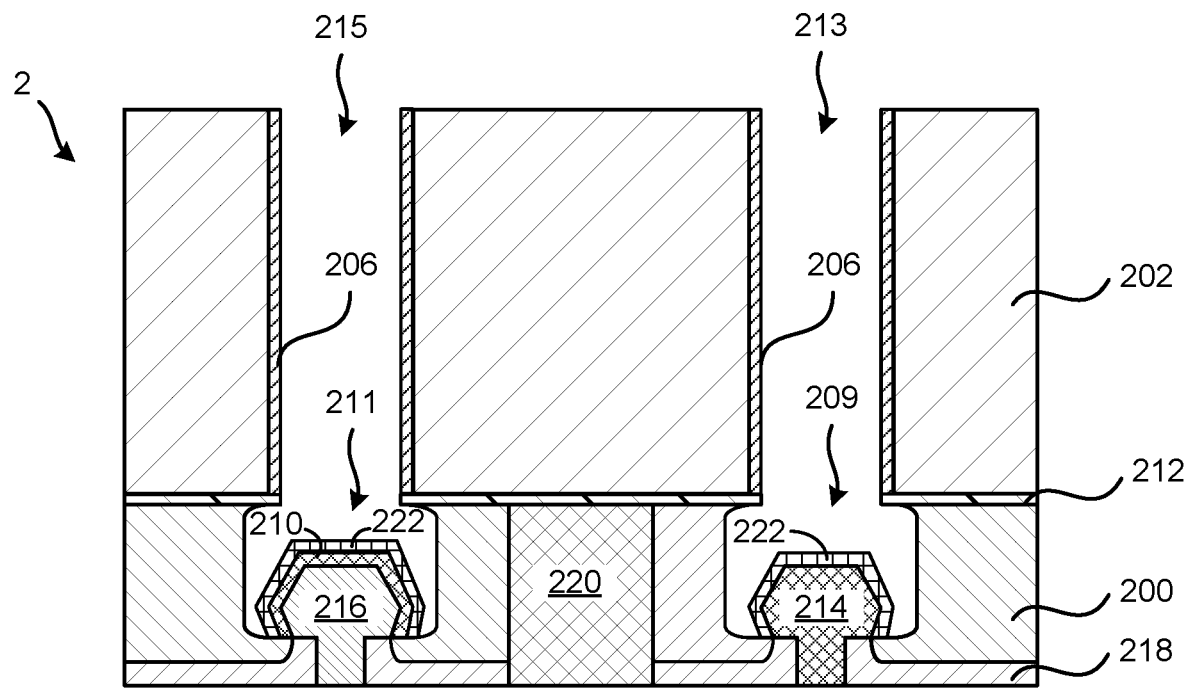

FIG. 2F shows a second metal-containing layer 222 that is deposited on the substrate 2, including on the first metal silicide layer 210 on the first raised contact 216 and on the second raised contact 214. The second metal-containing layer 222 may be deposited by vapor phase deposition, for example by CVD, PECVD, ALD, PEALD, or sputtering. In some examples, the second metal-containing layer can include Ti metal, Ni metal, NiPt alloy, Co metal, Mo metal, W metal, or V metal.

Figure 2G:
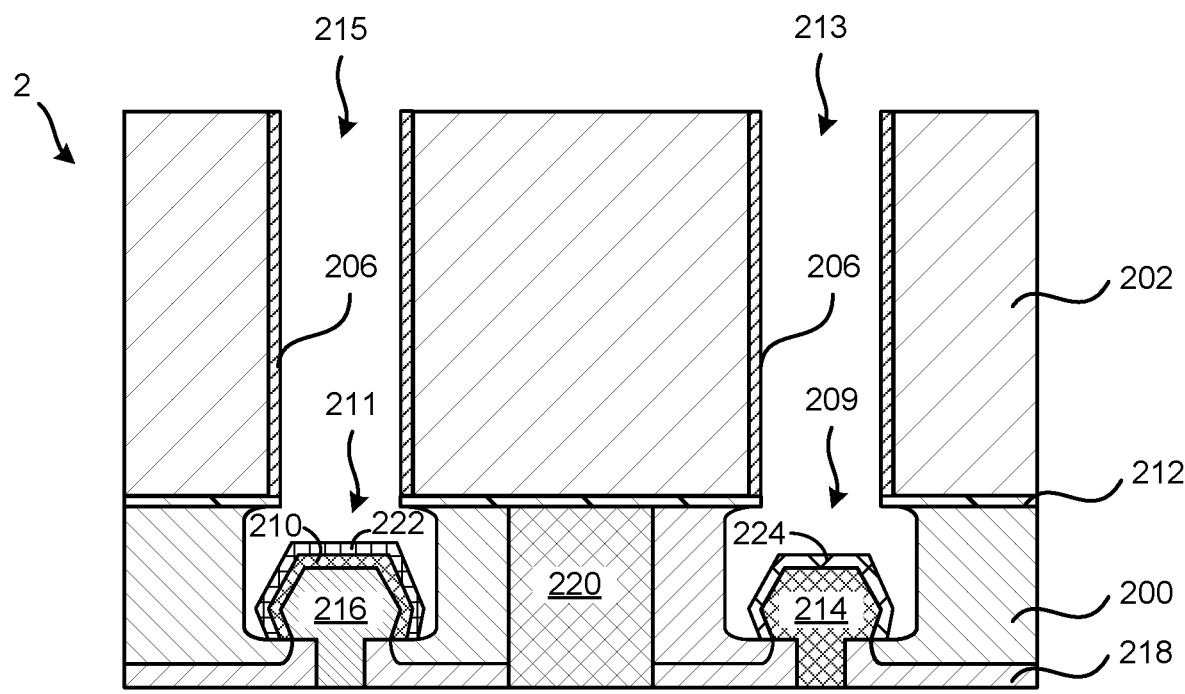
Figure 2H:
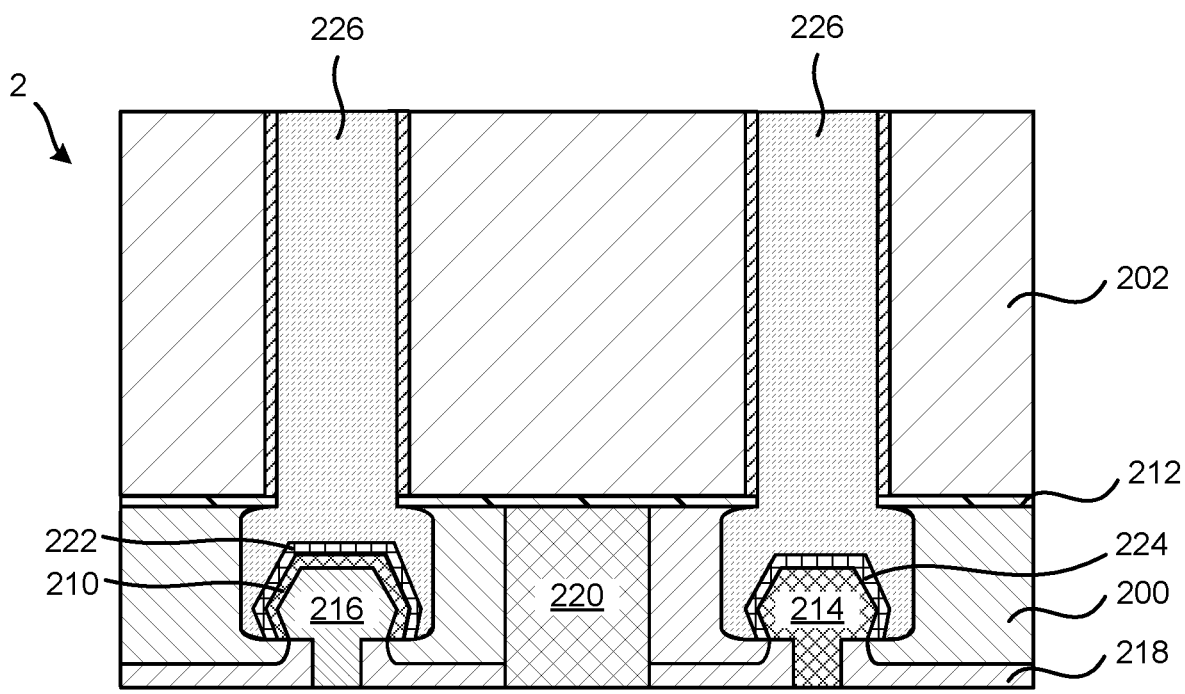

FIG. 2G shows the substrate 2 following a substrate annealing process that reacts the second metal-containing layer 222 with the second semiconductor material of the second raised contact 214 to form a second metal silicide layer 224. In some examples, the second metal silicide layer 224 can include $TiSi_x$, $NiSi_x$, $NiPtSi_x$, $CoSi_x$, $MoSi_x$, $WS_x$, $VSi_x$, or a combination thereof. Although not shown in FIG. 2G, only a portion of the second metal-containing layer 222 may react to form the second metal silicide layer 224 on the second raised contact 214, thereby leaving an unreacted portion of the second metal-containing layer 222 on the second metal silicide layer 224. FIG. 2H shows the recessed features 215 and 213 and the contact openings 211 and 209 filled with a metal 226. In one example, the metal 226 may be selected from the group consisting of Ru metal, Rh metal, Os metal, Pd metal, Ir metal, Pt metal, Ni metal, Co metal, W metal, and a combination thereof.

In one embodiment, any unreacted second metal-containing layer 222 on the first metal silicide 210 and on the second metal silicide layer 224 may optionally be removed from the substrate 2 in a dry or wet etching process, prior to filling the recessed features 215 and 213 with the metal 226.

Methods for or selectively depositing metal-containing layers on a substrate and forming metal silicides for semiconductor devices have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
   providing a substrate containing a first semiconductor material that includes germanium (Ge) and a second semiconductor material that includes doped silicon (Si);
   treating the first semiconductor material and the second semiconductor material with an oxidation source that includes a plasma-excited process gas containing $H_2$ and $O_2$, wherein the oxidation source selectively reacts with the second semiconductor material to form an oxide layer on the second semiconductor material relative to the first semiconductor material;
   exposing the substrate to a first metal-containing precursor that selectively deposits a first metal-containing layer on the first semiconductor material relative to the oxide layer on the second semiconductor material, wherein the first metal-containing layer contains ruthenium (Ru) metal, platinum (Pt) metal, cobalt (Co)

metal, nickel (Ni) metal, palladium (Pd) metal, molybdenum (Mo) metal, tungsten (W) metal, vanadium (V) metal, or a combination thereof.

2. The method of claim 1, further comprising annealing the substrate to react the first metal-containing layer with the first semiconductor material.

3. The method of claim 2, following the annealing, removing any remaining unreacted portion of the first metal-containing layer from the substrate.

4. The method of claim 2, further comprising:
removing the oxide layer from the second semiconductor material.

5. The method of claim 4, further comprising:
following the removing, depositing a second metal-containing layer on the second semiconductor material.

6. The method of claim 5, further comprising:
annealing the substrate to react the second metal-containing layer with the second semiconductor material.

7. The method of claim 5, wherein the second metal-containing layer includes titanium (Ti) metal, nickel (Ni) metal, a NiPt alloy, cobalt (Co) metal, molybdenum (Mo) metal, tungsten (W) metal, vanadium (V) metal, or a combination thereof.

8. The method of claim 1, wherein the first semiconductor material includes doped SiGe or doped Ge and the second semiconductor material includes doped Si.

9. The method of claim 1, wherein the substrate includes a positive-channel field emission transistor (PFET) contact region that contains the first semiconductor material and a negative-channel field emission transistor (NFET) contact region that includes the second semiconductor material.

10. A substrate processing method, comprising:
providing a substrate containing a first semiconductor material that includes germanium (Ge) and a second semiconductor material that includes doped Si;
treating the substrate with an oxidation source that includes a plasma-excited process gas containing $H_2$ and $O_2$, wherein the oxidation source that selectively reacts with the first semiconductor material to forms an oxide layer on the second semiconductor material relative to the first semiconductor material;
exposing the substrate to a first metal-containing precursor that selectively deposits a first metal-containing layer on the first semiconductor material relative to the oxide layer on the second semiconductor material;
annealing the substrate to react the first metal-containing layer with the first semiconductor material;
removing the oxide layer from the second semiconductor material;
depositing a second metal-containing layer on the second semiconductor material; and
annealing the substrate to react the second metal-containing layer with the second semiconductor material,
wherein the first metal-containing layer contains ruthenium (Ru) metal, platinum (Pt) metal, cobalt (Co) metal, nickel (Ni) metal, palladium (Pd) metal, molybdenum (Mo) metal, tungsten (W) metal, vanadium (V) metal, or a combination thereof, and wherein the second metal-containing layer includes titanium (Ti) metal, nickel (Ni) metal, NiPt alloy, cobalt (Co) metal, molybdenum (Mo) metal, tungsten (W) metal, vanadium (V) metal, or a combination thereof.

11. The method of claim 10, wherein the first semiconductor material includes doped SiGe or doped Ge and the second semiconductor material includes doped Si.

12. The method of claim 10, wherein the substrate includes a positive-channel field emission transistor (PFET) contact region that contains the first semiconductor material and a negative-channel field emission transistor (NFET) contact region that includes the second semiconductor material.

13. The method of claim 1, wherein the first semiconductor material is doped with boron (B), gallium (Ga), or aluminum (Al), and the second semiconductor material is doped with phosphorus (P), antimony (Sb), arsenic (As), or bismuth (Bi).

14. The method of claim 10, wherein the first semiconductor material is doped with boron (B), gallium (Ga), or aluminum (Al), and the second semiconductor material is doped with phosphorus (P), antimony (Sb), arsenic (As), or bismuth (Bi).

\* \* \* \* \*